(12) United States Patent
Bolognia

(10) Patent No.: US 9,116,022 B2
(45) Date of Patent: Aug. 25, 2015

(54) COMPACT SENSOR MODULE

(71) Applicant: ANALOG DEVICES, INC., Norwood, MA (US)

(72) Inventor: David Bolognia, North Andover, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 137 days.

(21) Appl. No.: 13/708,727

(22) Filed: Dec. 7, 2012

(65) Prior Publication Data

US 2014/0159226 A1 Jun. 12, 2014

(51) Int. Cl.
*H01L 23/34* (2006.01)
*G01D 11/24* (2006.01)
*H01L 31/0203* (2014.01)

(52) U.S. Cl.
CPC .......... *G01D 11/245* (2013.01); *H01L 31/0203* (2013.01); *Y10T 29/49126* (2015.01)

(58) Field of Classification Search
USPC .............. 257/713, 773, 719, 675, 706, 796, 257/E23.051, E23.101, 417, 415, 418, 253, 257/254
See application file for complete search history.

(56) References Cited

U.S. PATENT DOCUMENTS

| | | | |
|---|---|---|---|
| 4,883,967 A | 11/1989 | Tsutsui et al. | |
| 6,396,898 B1 | 5/2002 | Saito et al. | |
| 6,573,506 B2 | 6/2003 | Sato et al. | |
| 7,067,817 B2 | 6/2006 | Suganuma et al. | |
| 7,358,501 B2 | 4/2008 | Danzer et al. | |
| 7,468,514 B1 | 12/2008 | Suzuki et al. | |
| 7,504,637 B2 | 3/2009 | Thorne | |
| 7,544,947 B2 | 6/2009 | Kerwin et al. | |
| 2002/0011572 A1 | 1/2002 | Kajiwara et al. | |
| 2003/0010924 A1 | 1/2003 | El-Hanany et al. | |
| 2003/0097875 A1 | 5/2003 | Lentz et al. | |
| 2004/0223583 A1 | 11/2004 | Tsujii | |
| 2005/0029463 A1 | 2/2005 | Kaemmerer | |
| 2005/0067178 A1* | 3/2005 | Pearson et al. | 174/52.4 |
| 2005/0285973 A1 | 12/2005 | Singh et al. | |
| 2006/0223227 A1* | 10/2006 | Kubota et al. | 438/106 |
| 2007/0221859 A1 | 9/2007 | Nakata | |
| 2008/0011959 A1 | 1/2008 | Thorne | |

(Continued)

FOREIGN PATENT DOCUMENTS

JP 2002-022841 1/2002

OTHER PUBLICATIONS

Maloney, "Close Cooperation Among a Global Engineering Team Led to the Success of the Lightspeed VCT Medical Scanner," Test & Measurement World, Aug. 2005, 5 pages.

(Continued)

*Primary Examiner* — Timor Karimy
(74) *Attorney, Agent, or Firm* — Knobbe, Martens, Olson & Bear LLP

(57) ABSTRACT

Various embodiments of a compact sensor module are disclosed herein. The sensor module can include a stiffener and a sensor substrate having a mounting segment and a first wing segment extending from the mounting segment. The first wing segment may be folded around an edge of the stiffener. A sensor die may be mounted on the mounting segment of the sensor substrate. A processor substrate may be coupled to the sensor substrate. A processor die may be mounted on the processor substrate and may be in electrical communication with the sensor die.

26 Claims, 8 Drawing Sheets

(56) References Cited

U.S. PATENT DOCUMENTS

| | | |
|---|---|---|
| 2008/0283764 A1 | 11/2008 | Kerwin |
| 2009/0084971 A1 | 4/2009 | Ohta et al. |
| 2010/0078565 A1 | 4/2010 | Tsubota et al. |
| 2011/0133939 A1 | 6/2011 | Ranganathan et al. |
| 2011/0272588 A1 | 11/2011 | Jadrich et al. |

OTHER PUBLICATIONS

U.S. Appl. No. 13/405,594, filed Feb. 27, 2012, Bolognia.
International Search Report and Written Opinion of the International Search Authority in PCT/US2013/027643, dated Jun. 24, 2012, 12 pages.
Office Action in U.S. Appl. No. 13/405,594, dated Aug. 6, 2013.

\* cited by examiner

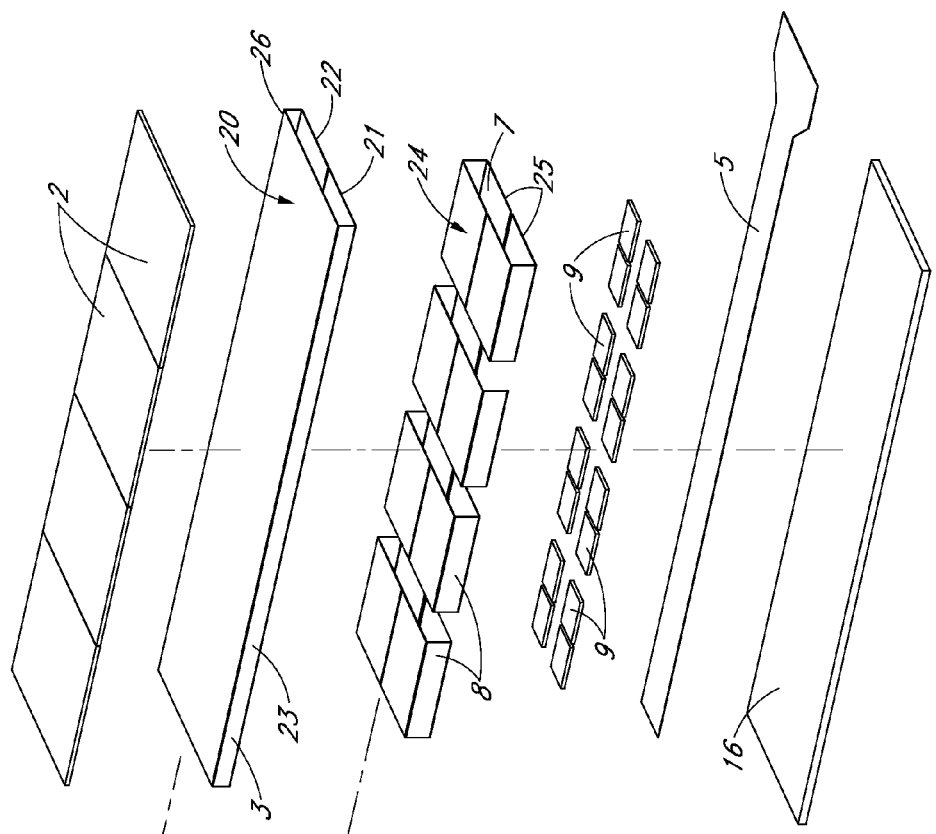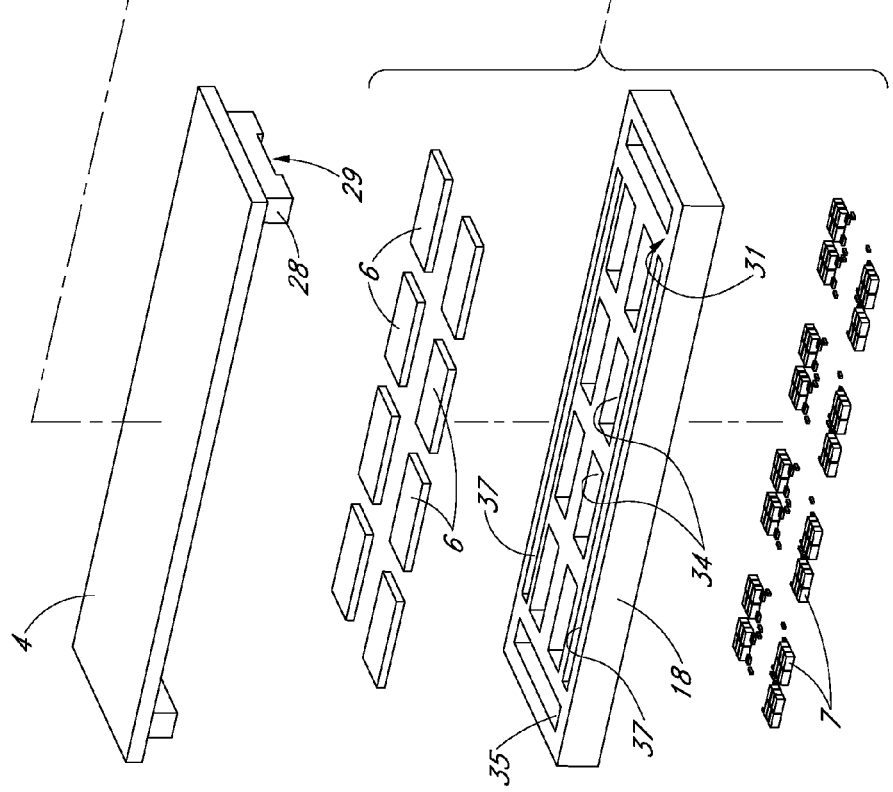
FIG. 3

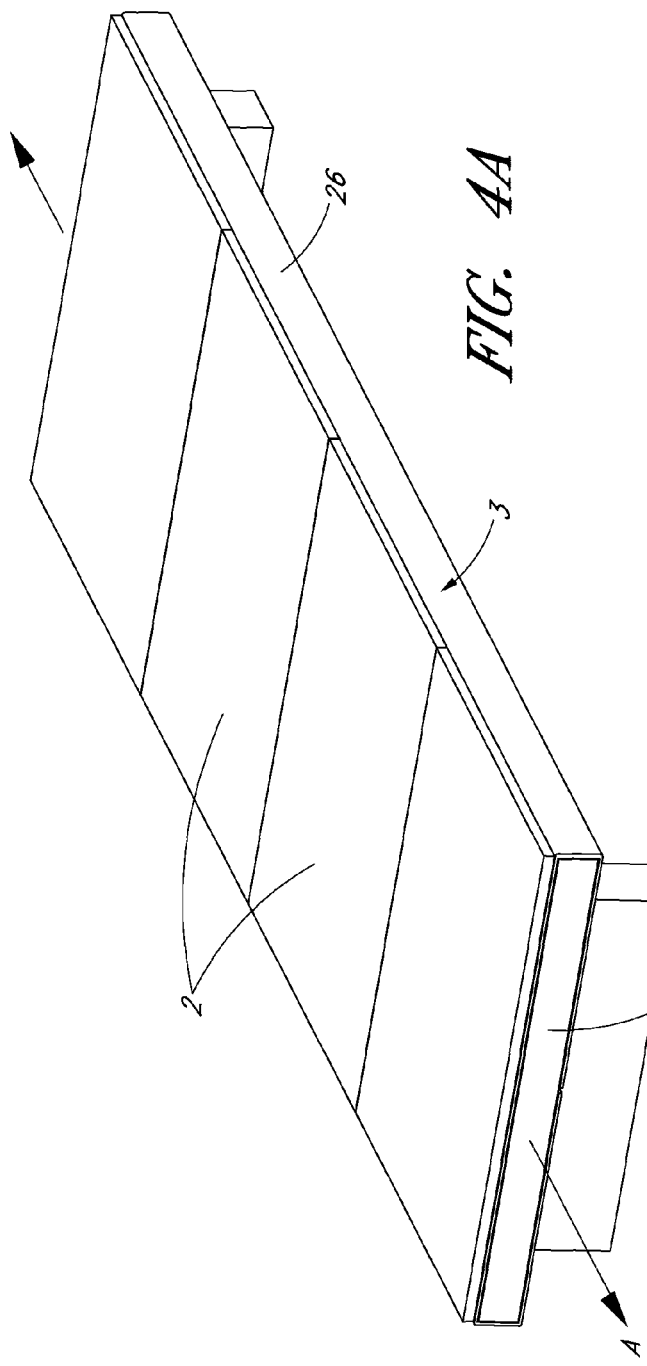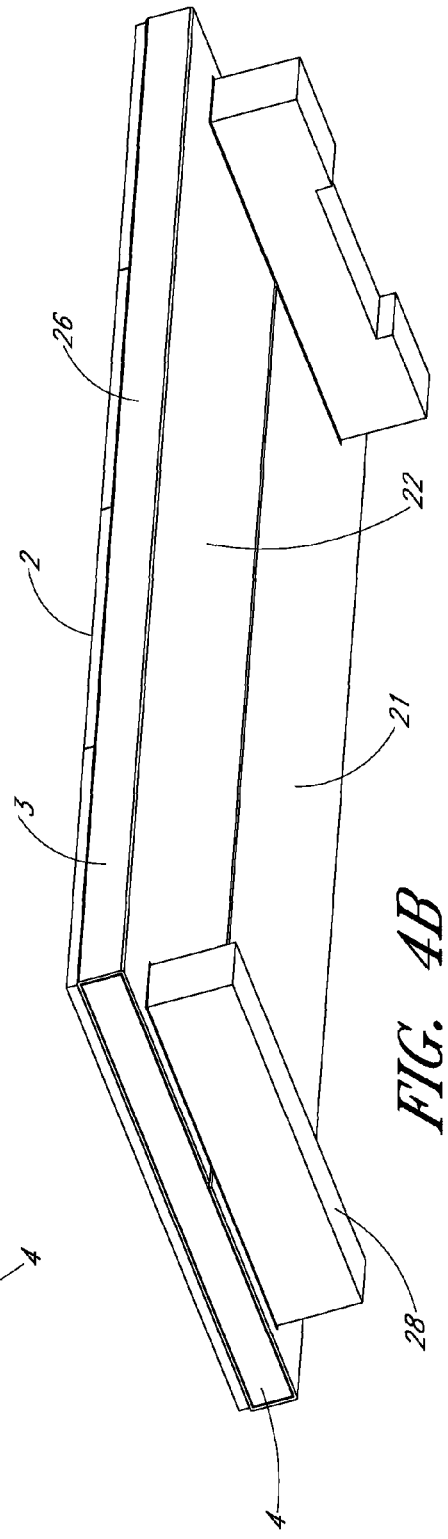

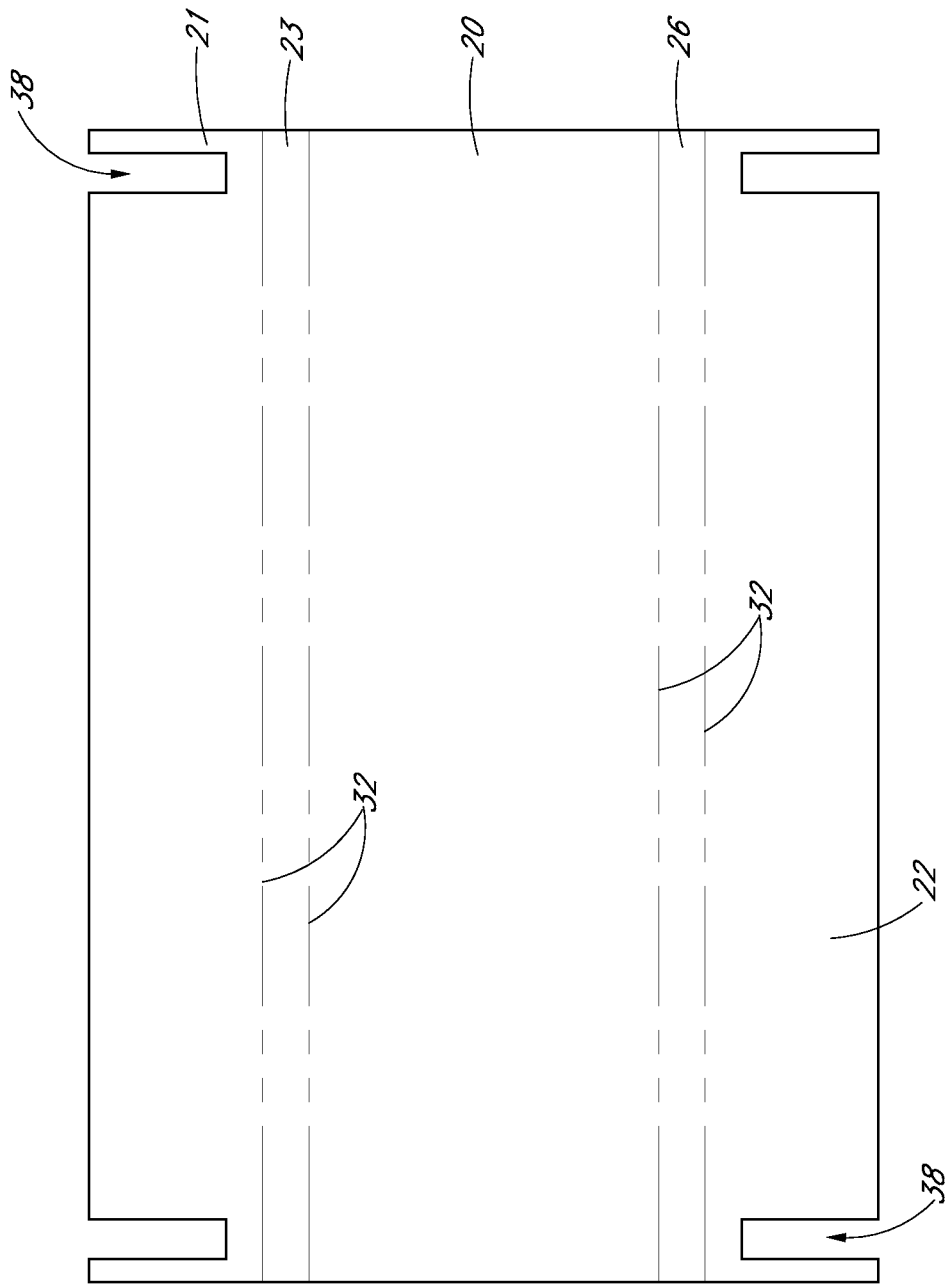

COMPACT SENSOR MODULE

BACKGROUND OF THE INVENTION

1. Field of the Invention

The field of the invention relates generally to a sensor module including a sensor and processing electronics.

2. Description of the Related Art

Sensor modules that include both a sensor and a processor (e.g., a general purpose processor or an Application-Specific Integrated Circuit, or ASIC) can be useful in a variety of optical, electrical, and electronic applications. In some implementations, it can be desirable to arrange the sensor module so that the sensor and processor are positioned relatively close to one another. For example, analog signals can experience parasitic losses as the signals are transmitted over a distance, which can degrade the accuracy and quality of the detected signal. Positioning the sensor near the processor can reduce or eliminate parasitic losses associated with signal transmission between the sensor and the processor. The processor can then perform various preconditioning and/or preprocessing operations, such as converting analog signals to digital signals, within the sensor module. The processor can transmit the processed digital signals to an external control module, which can be located far from the sensor, with minimal or no parasitic transmission losses to the signals.

One problem associated with positioning the processor near the sensor is that the heat generated by the processor may be transmitted to the sensor. It can be undesirable to transmit heat to the sensor for a variety of reasons. For example, the heat can cause damage due to a mismatch of the thermal coefficients among the parts. Heating the sensor can also damage sensor components or can interfere with the signals detected by the sensor. Therefore, while it can be advantageous to position the processor near the sensor to improve the quality of the signals detected and transmitted from the sensor, it is also important to prevent the sensor from overheating due to operation of the nearby processor.

Another consideration when designing sensor modules is ensuring that the sensor module (e.g., including the sensor and the processor) is compact or small enough to comply with the overall system design requirements, which can be important whether the modules are employed individually or are assembled in an array. For example, in some arrangements, an array of sensor modules is used to detect signals received in various locations or at different angles. In some applications, an array of sensor modules can be used for imaging applications, such as for x-ray detection in a computed tomography (CT) device. Arrays can include one-dimensional strings or two-dimensional (2D) arrays. CT devices can be used in a variety of applications, including medical imaging, industrial imaging, nondestructive testing, imaging subsurface minerals, and various other uses. Because the sensor modules are positioned adjacent one another in the array in some implementations, the sensor, the processor, and other components must fit within their associated area in the array. Moreover, because there are neighboring sensor modules on each side of a particular sensor module, features connecting the sensor module to the external control module should not interfere with neighboring sensor modules. In other imaging applications, sensor modules can be used to detect sound waves within an ultrasound system. In yet other implementations, sensor modules can be employed in nuclear imaging applications, such as in positron emission tomography (PET) scans and gamma ray imaging applications. In nuclear imaging applications, a sensor (or sensor array in some embodiments) can be used to image an object (e.g., a patient) that has been provided with (e.g., ingested or been injected with) a radioactive tracer material.

Accordingly, it can be advantageous to provide a compact sensor module that positions the sensor close to processing electronics while ensuring that the sensor and/or sensor substrate is sufficiently insulated from heat generated by the processing electronics.

SUMMARY

In one embodiment, a sensor module is disclosed. The sensor module can include a stiffener. A sensor substrate can have a mounting segment and a first wing segment extending from the mounting segment and folded around an edge of the stiffener. A sensor die can be mounted on the mounting segment of the sensor substrate. A processor substrate can be coupled to the sensor substrate. A processor die can be mounted on the processor substrate and can be in electrical communication with the sensor die.

In another embodiment, a method for forming a sensor module is disclosed. The method can comprise folding a first wing segment of a sensor substrate around an edge of a stiffener. The first wing segment can extend from a mounting segment of the sensor substrate. Further, the method can include mounting a sensor die on the mounting segment of the sensor substrate. A processor substrate can be coupled to the sensor substrate. A processor die can be mounted on the processor substrate. The processor die can be in electrical communication with the sensor die.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Specific implementations of the invention will now be described with reference to the following drawings, which are provided by way of example, and not limitation.

FIG. 3 is a perspective, exploded view of the compact sensor module of FIG. 2.

FIGS. 4A-4B are perspective views of a stiffener, sensor dies, and sensor substrate shown in FIG. 3.

FIG. 4C is a plan view of a sensor substrate in an unfolded configuration.

DETAILED DESCRIPTION

Embodiments disclosed herein describe systems, methods, and apparatus relating to compact sensor modules having one or more sensor die(s) and processor die(s) in electrical communication with the sensor die(s). In the disclosed embodiments, the sensor die(s) may be physically positioned near an associated processor die (or multiple processor dies) to reduce parasitic losses that may occur when the signal from the sensor die(s) is transmitted to the processor die(s) for pre-processing (e.g., analog-to-digital conversion). To prevent heat generated by the processor die(s) from damaging the sensor die(s), various intervening structural members may be disposed between the sensor die(s) and the processor die. The sensor die(s), processor die(s), passive components, substrates, and structural members may be packaged in a compact manner to provide a sensor package having a low profile.

Figure 1:
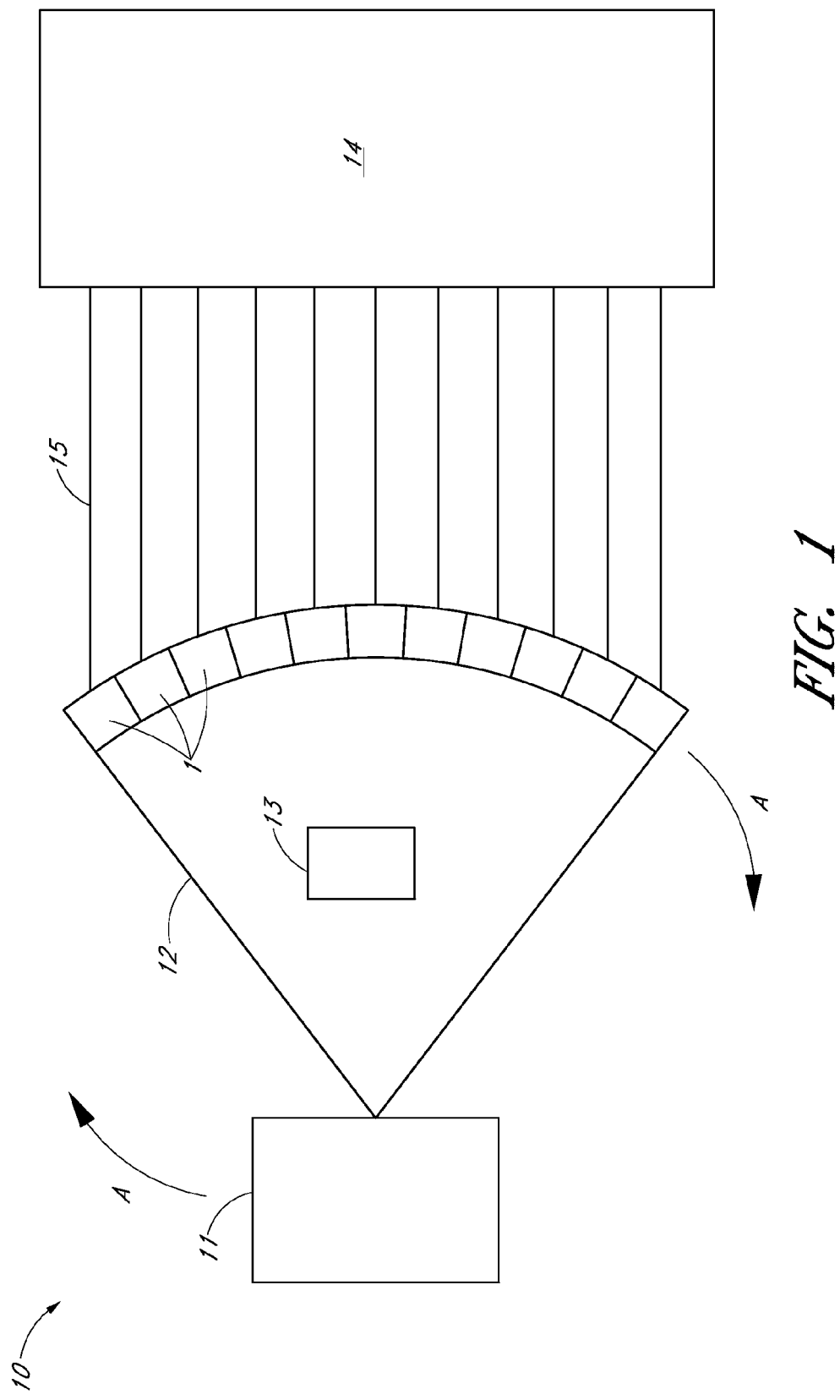
FIG. 1 is a schematic plan view of an imaging system, according to one embodiment.

FIG. 1 illustrates an imaging system 10 according to one embodiment. In some implementations, the imaging system 10 can be a computed tomography (CT) device. CT devices are useful in a variety of fields, including medical imaging, industrial imaging, nondestructive testing, and subsurface imaging. In the imaging system 10 of FIG. 1, a source 11 can emit radiation 12 in the direction of an object 13 to be imaged (e.g., a patient). In one embodiment, the source 11 emits x-ray radiation. Skilled artisans will understand that there are various conventional mechanisms to emit radiation for imaging purposes. After some portion of the radiation 12 passes through the object 13, it reaches a one-dimensional (1D) or two-dimensional (2D) array of sensor modules 1 positioned opposite the source 11. The sensor modules 1 can be configured to convert detected radiation (e.g., visible light) to electrical signals using a photodiode array (PDA), which can be the sensor of this imaging example. In some implementations, the sensor module 1 may also be configured to convert detected x-ray radiation to visible light, or the system 10 can include a separate scintillator for that purpose. In other implementations, detected x-ray radiation may be converted to electrical signals in other ways. The sensor module 1 is also configured to convert the analog signals received from the PDA into digital signals that can be transmitted by transmission elements 15 to an external control module 14. The sensor module 1 can also perform various other preprocessing and/or preconditioning operations on the detected signals before transmission to the control module 14. After the processed digital signals are received by the control module 14, the control module 14 can further process the digital signals into a readable output, such as an image on a display device or a report of various measured values calculated from the received signals. To obtain a full 3D image of the object 13, the system 10 can rotate around the object 13 in the direction A shown in FIG. 1 to obtain images of the subject 13 at various angles.

In other embodiments, the imaging system can be an ultrasound device. Although an ultrasound device is not expressly illustrated herein, it should be appreciated that an ultrasound device, according to some embodiments, can include a source of ultrasonic waves and a detector (or detector array) that includes one or more sensor modules similar to those described in more detail below. Furthermore, the sensor module(s) can be used in nuclear imaging implementations, such as PET scans and gamma ray imaging techniques. In yet other embodiments, the sensor modules can be used in various non-imaging arrangements, e.g., electrical, electronic, or optical applications that employ a compact module that includes both a sensor and a processor. For example, microelectromechanical systems (MEMS) devices, such as MEMS microphones and accelerometers, may include both a sensor die and a processor die near the sensor in order to process signals from the sensor. In these embodiments, sensor modules similar to those illustrated herein may be useful in providing a compact sensor package, while thermally insulating the sensor from the processor.

Figure 2:
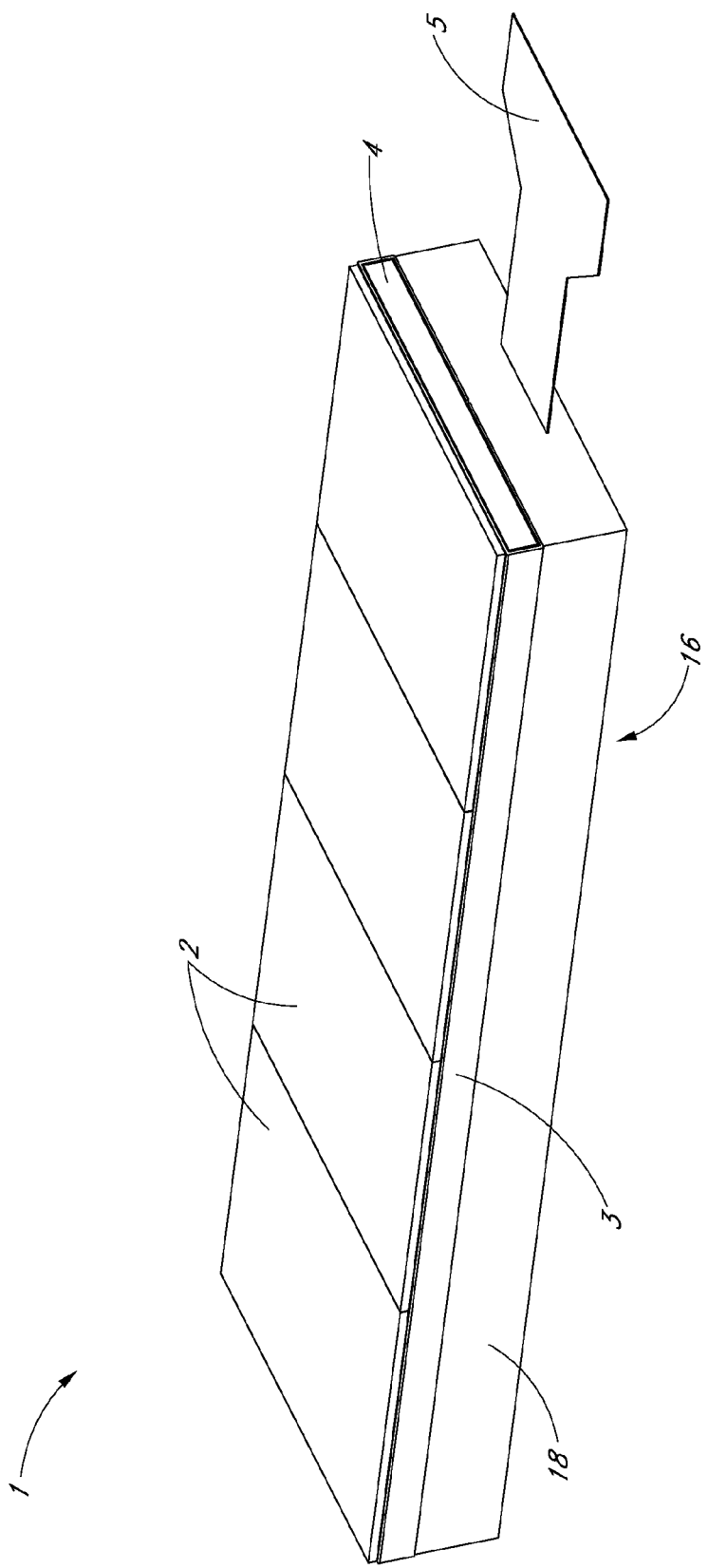
FIG. 2 is a perspective, assembled view of a compact sensor module, according to one embodiment.

Turning to FIG. 2, a perspective view of an example sensor module 1 is illustrated. The sensor module 1 can include one or more sensor dies 2 mounted on a flexible sensor substrate 3. In some embodiments, the sensor die 2 can comprise an x-ray sensing device, including, e.g., a PDA or other imaging sensor. In x-ray applications, the module may also include a collimator and a scintillator array for converting the x-rays to visible light, or the collimator and scintillator can be separately provided over the module within the imaging system. In still other embodiments, the sensor die 2 can include any other suitable device configured to detect signals, including, e.g., MEMS sensors and other electrical and electronic sensors. Note that, although the sensor module 1 illustrates four sensor dies 2, in other embodiments, it is possible to only use one, two, three, or greater than four sensor dies.

The sensor substrate 3 can be a flexible substrate with integrated bond pads, leads and traces, which allows for a low profile. The sensor substrate 3 can include multiple conductive leads configured to electrically couple to external devices or substrates. In some embodiments, the sensor die 2 can be mechanically and electrically coupled to the sensor substrate 3 by way of a gold thermocompression bond with copper pillars. In other embodiments, the sensor die 2 can be soldered to the sensor substrate 3, while in yet other embodiments, the sensor die 2 can be coupled to the sensor substrate 3 using anisotropic conductive film (ACF) or non-conductive paste (NCP) technologies.

Flexible substrates can be useful in arrangements where it is desirable for the substrate to conform to a particular geometry employed within a system. Flexible substrates can be made of a flexible plastic material, such as polyimide or PEEK and can include integrated bond pads, traces and leads similar to those used in conventional PCB substrate technologies. The flexible substrate can be easily bent or folded to conform to a particular geometry, which permits contacting downstream components in a variety of configurations. Furthermore, traces and leads can be patterned on the flexible substrate in very small dimensions. For example, in some embodiments, the traces can have line widths and spaces on the order of about 15 to 20 µm, and the leads or bond pads can have widths or diameters of about 200-300 µm with similar spacing, such that the pitch is on the order of 400-600 µm. By employing small lead pitch, it is possible for the sensor substrate to electrically communicate with a large number of pixels (e.g., corresponding to portions of the PDA), which can advantageously increase the resolution of the imaging device. In one embodiment, each of the four illustrated sensor dies 2 can include 480 pixels electrically coupled to the sensor substrate 3, for a total of 1920 pixels in the 4-sensor array shown in FIG. 2. In other embodiments, each sensor die can include a fewer or a greater number of pixels, including e.g., 512 pixels per sensor die. In yet other embodiments, the line widths and spaces can be much smaller or larger, depending on the desired lead density for a particular arrangement. The dimensions of the sensor module 1 can vary according to the desired implementation. For example, in some embodiments, the illustrated four-die sensor module can have a total length in a range of about 60 mm to about 100 mm and a width in a range of about 20 mm to about 30 mm. The height or thickness of the sensor module 1 can be relatively small, e.g., in a range of about 5 mm to about 10 mm in various embodiments.

Returning to FIG. 2, the sensor substrate 3 can be mounted on or coupled to a portion of a stiffener 4. As will be discussed in more detail below, the stiffener 4 can provide structural support for the sensor module 1 and can assist in thermally separating the sensor dies 2 from the processor dies, as described herein. As shown in FIG. 2 and discussed in more detail below, the sensor substrate 3 can be wrapped around the stiffener 4. The ends of the flexible sensor substrate 3 that are wrapped around the stiffener 4 may electrically couple to a flexible processor substrate, as illustrated and described with respect to, e.g., FIGS. 3 and 5. The stiffener 4 can be made of any suitable material, such as a metal, e.g., aluminum. In other arrangements, the stiffener 4 can be made of a plastic or ceramic.

The stiffener 4 and the sensor substrate 3 can couple to a carrier 18 configured to support the sensor module 1. As explained below, the carrier 18 can also support a radiation shield, and the flexible processor substrate(s) described herein can be folded about the carrier 18. Further, a connector 5 can extend through an opening in the stiffener 4. As explained below, the connector 5 can electrically couple the processor substrate(s) to the external controller 14, which may be positioned away from the sensor module 1. The connector 5 may also be made of a flexible material, such as a pigtail connector, and can include embedded metallic traces and conductive contacts configured to electrically connect to the processor substrate(s) described below. The sensor module 1 can also include a heat spreader coupled to a bottom side of the carrier 18, as described with respect to FIG. 3 below. The heat spreader can be formed of a thermally conductive material, such as a metal, to conduct heat from the processors in a direction away from the sensor dies.

FIG. 3 is a perspective, exploded view of the compact sensor module of FIG. 2. As mentioned above, the sensor module 1 can include one or more sensor dies 2 and the flexible sensor substrate 3. The flexible sensor substrate 3 is illustrated in a folded configuration, such that the sensor substrate 3 includes a mounting segment 20, a first wing segment 21, a second wing segment 22, a first side segment 23 between the mounting segment 20 and the first wing segment 21, and a second side segment 26 between the mounting segment 20 and the second wing segment 22. The first and second wing segments 21, 22 of the sensor substrate 3 may be bent or folded around edges of the stiffener 4. Also, as shown, the stiffener 4 can include a plurality of walls 28 extending from a base portion of the stiffener 4. At least one of the walls 28 can include an opening 29 sized and shaped to allow the connector 5 to pass therethrough.

The sensor module 1 can also include one or more flexible processor substrates 8, shown in a folded condition in FIG. 3, and one or more processor dies 9 to be mounted on and electrically coupled to the flexible processor substrate(s) 8. In FIG. 3, two processor substrates 8 are positioned below each sensor die 2, for a total of eight flexible processor substrates 8 for the illustrated four-sensor die module. It should be appreciated, however, that only one processor substrate 8 may be positioned below each sensor die 2 in some arrangements; in other embodiments, more than two processor substrates 8 may be positioned below each sensor die 2; and as noted above, the module 1 can have greater or fewer than four sensor dies. As will be described in more detail below, each flexible processor substrate 8 can include a first mounting segment 24 folded over a first side 31 of the carrier 18 and a second mounting segment 25 folded over a second side of the carrier. As explained below, the first and/or second mounting segments 24, 25 of the processor substrate 8 can be inserted through slots 37 formed through the carrier 18.

The carrier 18 can include a top side 31 and a bottom side 33 (see FIG. 7B) opposite the top side 31. Apertures 35 may be formed near end regions of the carrier 18. As shown in FIG. 3, the apertures may be sized and shaped to receive the walls 28 of the stiffener 4. In addition, two slots 37 may be formed through the entire thickness of the carrier 18. The slots 37 may be sized such that the flexible processor substrate 8 can be fed through the slots 37 and folded around the carrier 18. Further, a plurality of shield recesses 34 may be formed in the top side 31 of the carrier 18. The shield recesses 34 can extend partly through the thickness of the carrier 18 and can be sized and shaped to receive radiation shields 6. The radiation shields 6 may be provided to block radiation emitted from the sensor die(s) 2 from impinging upon the processor die(s) 9 and damaging its components. In various arrangements the radiation shields 6 may be positioned within and coupled to the shield recesses 34 of the carrier 18 using an adhesive; in other arrangements, no adhesive may be used. One or more passive electronic components 7 (such as capacitors, resistors, inductors, etc.) can be coupled to the flexible processor substrate 8. As explained below with respect to FIG. 7B, the passive components 7 may be mounted to the processor substrate 8 and can be positioned within recesses formed in the bottom side 33 of the carrier 18.

Thus, for the illustrated embodiments, after assembly, the sensor substrate 3, the stiffener 4, the carrier 5, the processor substrate(s) 8, and the radiation shield 6 intervene between the processor die(s) 9 and the sensor die(s) 2, although not all these features will intervene in other embodiments. As explained herein, by folding the flexible processor substrate(s) 8 over the carrier 18, the processor die(s) 9 may be spaced apart from the sensor substrate 3 while still making electrical contact to the sensor substrate 3. The intervening carrier 18 and stiffener 4 can thereby act to thermally separate the processor die(s) 9 from the sensor die(s) 2 to prevent heat generated by the processor die(s) 9 from being transmitted to the sensor die(s) 2 and potentially damaging the sensor die(s) 2. To provide electrical communication between the sensor die(s) 2 and the processor die(s) 9, the first and second wing segments 21 and 22 of the sensor substrate 3 can electrically connect to the first mounting segment(s) 24 of the flexible processor substrate(s) 8. The electrical bonds between the processor substrate(s) 8 and the processor die(s) 9 can complete the electrical pathway between the sensor die(s) 2 and the processor die(s) 9. In various implementations, the flexible sensor substrate 3 (e.g., the first and second wing segments 21, 22) can be soldered to the first mounting segment(s) 24 of the flexible processor substrate(s) 8. In other embodiments, the flexible sensor substrate 3 can be electrically coupled to the processor substrate(s) 8 using ACF or NCP technologies. As with the sensor die(s) 2, the processor die(s) 8 may be electrically coupled to the processor substrate(s) 8 using a gold thermocompression bond with copper pillars; in other arrangements, solder may be used, or ACF or NCP techniques may be used.

The heat spreader 16 can be coupled to the carrier 18, and the connector 5 can electrically connect to the flexible processor substrate 8 and/or other components by way of the opening 29 within the stiffener 4. The opening 29 can be a through hole formed in the wall 28 of the stiffener 4. The connector 5 can extend along the length of the sensor module 1 and can electrically connect to all the processor substrates 8, e.g., to the second mounting segments 25 of the eight illustrated processor substrates 8. While FIG. 3 illustrates one example implementation of the sensor module 1, it should be appreciated that the particular ordering of components may vary in other implementations.

FIGS. 4A-4B are perspective views of the stiffener 4 shown in FIG. 3, with the flexible sensor substrate 3 wrapped around the stiffener 4 and including the sensor dies 2. FIG. 4C is a plan view of the sensor substrate 3 in an unfolded configuration. In FIG. 4C, dotted lines 32 are shown to illustrate the position of creases when the sensor substrate 3 may be folded about the stiffener 4 of FIGS. 4A-4B. The stiffener 4 can include the walls 28 extending from a base portion. As shown in FIG. 4C, the sensor substrate 3 can include wall openings 38 sized and shaped to allow the walls 28 to extend through the openings 38 when the sensor substrate 3 is folded or wrapped around the stiffener 4. In other embodiments, however, the stiffener 4 may not include walls. In yet other embodiments, the sensor substrate 3 may be short enough to wrap around the stiffener 4 in a space between the two walls 28 such that there may be no wall openings in the sensor substrate 3.

As seen in FIG. 3, the walls 28 can be configured to extend through apertures 35 in the carrier 18. A distal end portion of the walls 28 can be configured to contact the heat spreader 16 when the module 1 is assembled. The walls 28 can thereby provide a relatively solid or rigid connection between the stiffener 4 and the heat spreader 16 in the assembled module 1. In some arrangements, the walls 28 can be attached to the heat spreader using an adhesive to couple the stiffener 4 to the heat spreader 16 (shown in FIG. 3).

As shown in FIGS. 4A-4B, the flexible sensor substrate 3 can be wrapped around the stiffener 4 where creases are parallel to a longitudinal axis A of the sensor module 1. The four sensor dies 2 can be mounted adjacent one another in a direction substantially parallel to the longitudinal axis A. Advantageously, the sensor substrate 3 may include more electrical contacts in the longitudinal axis A than in its width or transverse direction (e.g., a direction perpendicular to the longitudinal axis A). By wrapping the sensor substrate 3 about the longitudinal axis A, therefore, the sensor module 1 can take advantage of the dense electrical contacts of the sensor substrate 3. In various embodiments, for example, the sensor substrate 3 can include over a thousand electrical contacts per side in the longitudinal axis A. The increased number of contacts can enable the sensor substrate 3 to receive data from a large number of pixels of the sensor dies 2. For example, in the disclosed embodiment, each sensor die 2 can include 480 pixels (or 512 pixels in other arrangements), and each pixel can include a channel, e.g., an electrical pathway, to a corresponding electrical contact on the sensor substrate 3. The dense contacts of the sensor substrate 3 can thereby enable the integration of processing signals from high resolution sensor dies 2.

Figure 5:
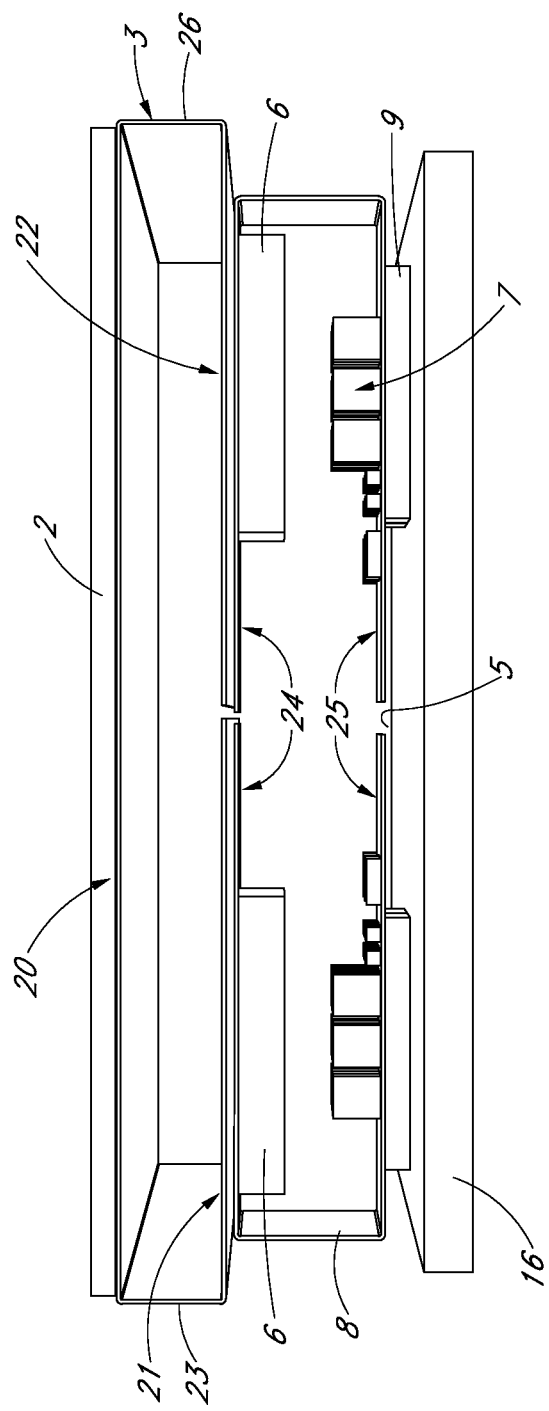
FIG. 5 is a side view of various internal components of the compact sensor module shown in FIG. 2 with the stiffener omitted for purposes of illustration.
Figure 6A:
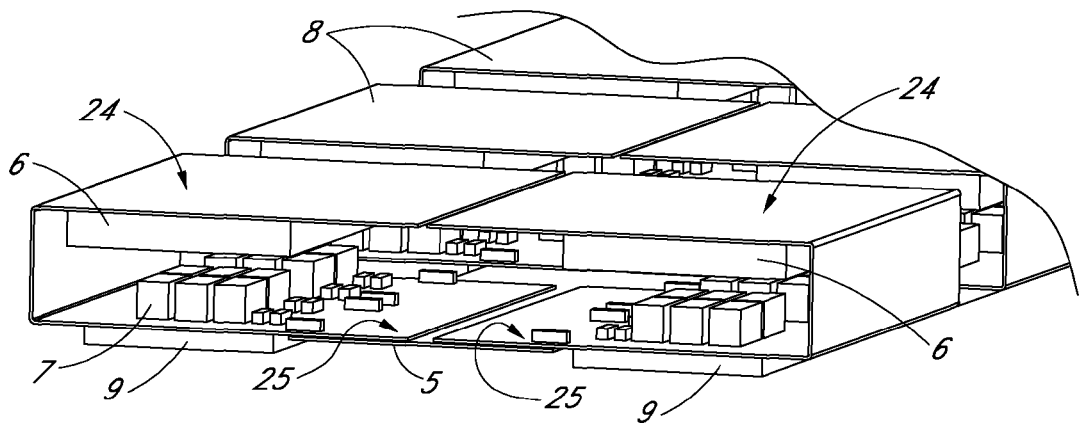
FIGS. 6A-6B are perspective views of internal components of the compact sensor module, including multiple flexible processor substrates, radiation shields, processor dies, and passive electronic components.
Figure 6B:
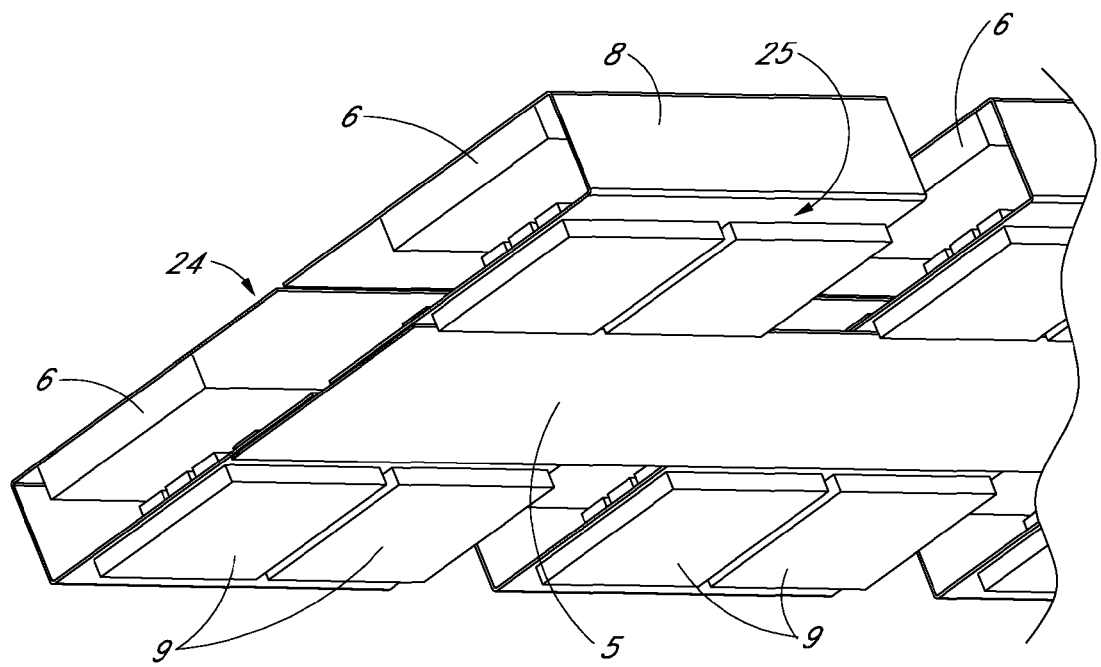

FIG. 5 is a side view of various internal components of the compact sensor module shown in FIG. 2. FIGS. 6A-6B are perspective views of the internal components of the compact sensor module, including multiple flexible processor substrates, radiation shields, processor dies, and passive electronic components. The carrier 18 and the stiffener 4 are not shown in FIG. 5 for purposes of illustration. Likewise, the carrier 18, the stiffener 4, the sensor substrate 3, and the sensor dies 2 are not illustrated in FIGS. 6A-6B for purposes of illustration.

As shown in FIG. 5, the first and second wing segments 21 and 22 of the flexible sensor substrate 3 can be coupled to the first mounting segments 24 of the illustrated processor substrates 8. As explained above, solder, or other electrically conductive adhesives, can electrically connect electrical contacts on the sensor substrate 3 with corresponding electrical contacts on the processor substrate 8. Internal traces of the sensor substrate 3 can provide electrical communication between the electrical contacts coupled to the sensor dies 2 and the electrical contacts coupled to the flexible processor substrate(s) 8.

As explained above, the first mounting segment 24 of the processor substrate 8 can be folded around a first side of the carrier 18, and the second mounting segment 25 can be folded around a second side of the carrier 18 (FIG. 3). The mounting segments 24, 25 may be inserted through the slots 37 of the carrier 18. As shown in FIGS. 5 and 6A-6B, the first and second mounting segments 24 and 25 may be folded in substantially the same direction as the sensor substrate 3, e.g., around the longitudinal axis A illustrated in FIGS. 4A-4B. Further, the processor substrates 8 associated with a particular sensor die 2 may be positioned adjacent one another in a direction transverse to the longitudinal axis A, e.g., transverse to the direction about which the processor substrates 8 are folded.

Internal traces within the processor substrates 8 can route signals from the sensor dies 2 to the processor dies 9 that are mounted on the second mounting segments 25 of the flexible processor substrates 8. Thus, analog signals detected by the sensor dies 2 can be transmitted to the mounting segment 20 of the sensor substrate 3 and through internal traces of the sensor substrate 3 to the first and second wing segments 21 and 22 of the flexible sensor substrate 3. The signals can then be transmitted to the first mounting segments 24 of the flexible processor substrates 8 and through internal traces of the flexible processor substrates 8 to the second mounting segments 25, where the signals are transmitted to the processor dies 9. Furthermore, one or more passive electronic components 7 may also be coupled to the second mounting segments 25 of the flexible processor substrates 8. The passive components 7 can include, e.g., capacitors and resistors for conditioning signals, such as to smooth the analog signals transmitted from the sensor dies 2.

As shown in FIG. 6A-6B, each flexible processor substrate 8 can be coupled to two processor dies 9. Since there are two processor substrates 8 positioned under and associated with each sensor die 2 in the embodiment of FIGS. 2 and 3, there are four processor dies 9 in electrical communication with the sensor die 2 in FIGS. 6A-6B. However, it should be appreciated that there may be fewer processor dies 9 associated with each sensor die 2, such as one, two, or three processor dies 9 in electrical communication with the sensor die 2. In other embodiments, there may be more than four processor dies 9 in communication with each sensor die 2.

Furthermore, the connector 5 (FIGS. 2 and 3) can extend along the longitudinal axis A of the sensor module 1. The connector 5 can electrically couple to the second mounting segments 25 of adjacent flexible processor substrates 8. In one embodiment, the second mounting segments 25 of the processor substrates 8 may be coupled to the connector 5 using ACF bonding technologies. In other embodiments, NCP, solder, or other conductive adhesives may be used to electrically connect the connector 5 to the flexible processor substrates 9. The connector 5 can extend outwardly through the aperture 29 of the carrier 18 (FIG. 3). The connector 5 can electrically connect to an external system, such as, e.g., the controller 14 (FIG. 1), to transmit the digital signals processed by the processor 9 to the controller 14.

Figure 7A:
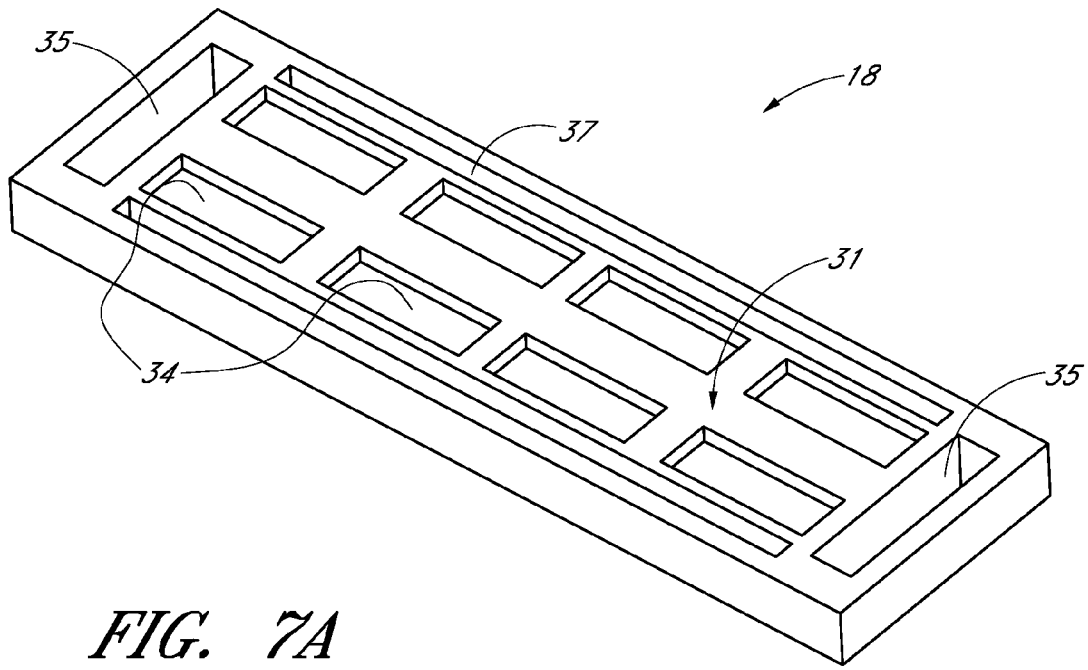
FIG. 7A is a perspective view of a top side of the carrier shown in FIG. 3.
Figure 7B:
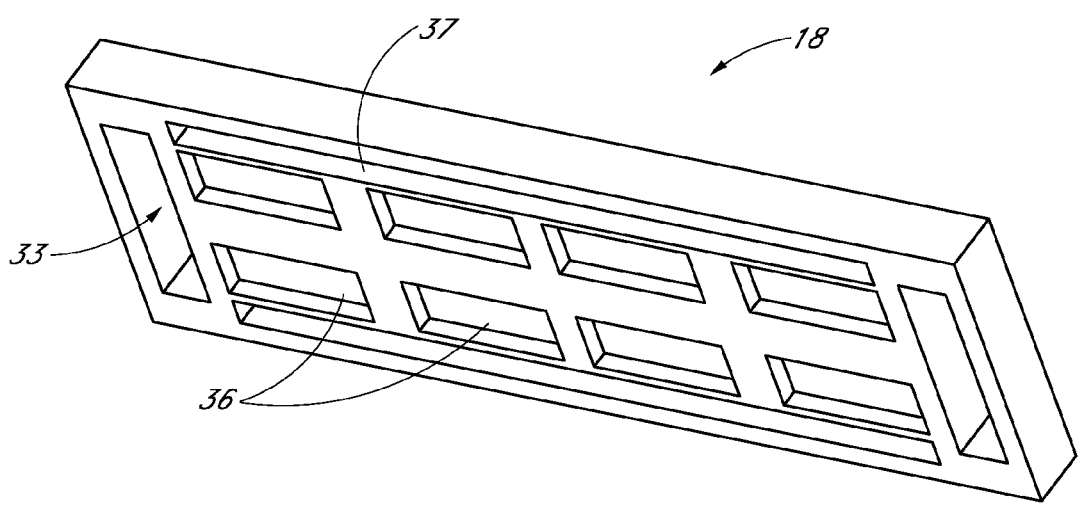
FIG. 7B is a perspective view of a bottom side of the carrier shown in FIG. 7A.

FIG. 7A is a perspective view of a top side 31 of the carrier 18 shown in FIG. 3, and FIG. 7B is a perspective view of a bottom side 33 of the carrier 18 shown in FIG. 7A. As explained above with respect to FIG. 3, the carrier 18 may include apertures 35 that are shaped to receive the walls 28 of the stiffener 4. The walls 28 of the stiffener 4 may therefore pass through the apertures 35 to couple to the heat spreader 16. One of the walls 28 can include the opening 29, and the connector 5 may extend through the opening 29 of the wall 28. Further, the carrier 18 can include two slots 37 sized and shaped such that portions of the flexible processor substrates 8 may pass through the slots 37 so that the mounting segments 24 and 25 of the processor substrates 8 may be folded over the top and bottom sides 31 and 33 of the carrier 18.

The carrier 18 may also include one or more shield recesses 34 in the top side 31 of the carrier 18. The shields 6 (FIGS. 5, 6A, and 6B) may be coupled to and positioned within the shield recesses 34 such that the first mounting segment 24 of the flexible processor substrate 8 may be folded over the top side 31 of the carrier without interference from the shields 6. Similarly, one or more component recesses 36 may be formed in the bottom side 33 of the carrier 18. The component recesses 36 may be sized and shaped to accommodate the passive electronic components 7 that are mounted to the second mounting segment 25 of the flexible processor substrates 8. In other embodiments, it should be appreciated that the shields 6 may be mounted within the recesses 36 on the bottom side 33 of the carrier 18, while the passive electronic components 7 may be mounted to the first mounting segment 24 of the flexible processor substrates 8 and positioned within the recesses 34 formed in the first side 31 of the carrier 18.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A sensor module comprising:
   a stiffener;
   a sensor substrate having a mounting segment and a first wing segment extending from the mounting segment, the first wing segment folded around an edge of the stiffener;
   a sensor die mounted on the mounting segment of the sensor substrate;
   a processor substrate coupled to the sensor substrate; and
   a processor die mounted on the processor substrate and in electrical communication with the sensor die.

2. The sensor module of claim 1, wherein the processor substrate is electrically and mechanically coupled to the sensor substrate.

3. The sensor module of claim 1, further comprising a second sensor die mounted adjacent the sensor die on the mounting segment of the sensor substrate.

4. The sensor module of claim 3, further comprising a third sensor die and a fourth sensor die mounted adjacent one another on the mounting segment of the sensor substrate.

5. The sensor module of claim 1, further comprising a heat spreader and a carrier, the carrier disposed between the stiffener and the heat spreader, wherein the stiffener is directly mechanically connected to the heat spreader.

6. The sensor module of claim 5, wherein a wall transverse to the heat spreader mechanically connects the stiffener and the heat spreader.

7. The sensor module of claim 6, wherein the wall extends through an aperture of the carrier.

8. The sensor module of claim 6, wherein the wall is integrally formed as part of the stiffener, the wall extending transversely from a base portion of the stiffener.

9. The sensor module of claim 5, wherein the stiffener is attached to the heat spreader with an adhesive.

10. An imaging device comprising an array of multiple sensor modules, each sensor module in the array comprising the sensor module of claim 1.

11. The imaging device of claim 10, wherein the imaging device is a computed tomography (CT device).

12. The sensor module of claim 1, further comprising a carrier, the processor substrate folded about the carrier about a first axis that is parallel to a second axis about which the first wing segment of the sensor substrate is folded.

13. The sensor module of claim 1, further comprising a carrier to which the processor substrate is coupled, wherein the sensor substrate, the stiffener, the carrier, and the processor substrate are disposed between the processor die and the sensor die.

14. The sensor module of claim 13, further comprising a radiation shield positioned between the processor die and the sensor die.

15. A sensor module comprising:
    a stiffener;
    a sensor substrate having a mounting segment and a first wing segment extending from the mounting segment, the first wing segment folded around an edge of the stiffener;
    a sensor die mounted on the mounting segment of the sensor substrate;
    a processor substrate coupled to the sensor substrate;
    a processor die mounted on the processor substrate and in electrical communication with the sensor die; and
    a second processor substrate, wherein the processor substrate is positioned below the sensor die and the second processor substrate is positioned below the second sensor die, wherein the processor substrate and the second processor substrate are coupled to the sensor substrate on a side of the stiffener opposite the sensor dies.

16. The sensor module of claim 15, wherein the sensor die and the second sensor die are positioned adjacent one another in a direction substantially parallel to an axis about which the sensor substrate is folded.

17. The sensor module of claim 16, wherein the processor substrate and the second processor substrate are folded about an axis substantially parallel to the axis about which the sensor substrate is folded.

18. The sensor module of claim 17, further comprising a third processor substrate and a fourth processor substrate, wherein the third processor substrate is positioned below the sensor die adjacent the processor substrate in a direction transverse to the axis about which the sensor substrate is folded, and wherein the fourth processor substrate is positioned below the second sensor die adjacent the second processor substrate in a direction transverse to the axis about which the sensor substrate is folded.

19. The sensor module of claim 15, further comprising a carrier configured to support the sensor module, wherein the processor substrate and the second processor substrate are folded about the carrier.

20. The sensor module of claim 19, further comprising a second processor die, wherein each of the processor substrate and the second processor substrate includes a first mounting segment folded over a first side of the carrier and a second mounting segment folded over a second side of the carrier opposite the first side of the carrier, and wherein the processor die and the second processor die are mounted on the second mounting segments of the processor substrate and the second processor substrate.

21. The sensor module of claim 20, further comprising a connector extending through the sensor module and electrically coupled to the second mounting segments of the processor substrate and the second processor substrate, the connector configured to provide electrical communication to an external device.

22. The sensor module of claim 20, further comprising a radiation shield positioned below the sensor die, the radiation shield positioned in a recess on the first side of the carrier between the first mounting segment of the processor substrate and the carrier.

23. A sensor module comprising:
 a stiffener;
 a sensor substrate supported by the stiffener;
 a sensor die mounted on and in electrical communication with the sensor substrate;
 a processor substrate in electrical communication with the sensor substrate;
 a processor die mounted on the processor substrate below the sensor die, wherein the processor die is in electrical communication with the sensor die through the processor substrate and the sensor substrate;
 a heat spreader below the processor die;
 a carrier housing between the stiffener and the heat spreader; and
 a wall connecting the stiffener to the heat spreader.

24. The sensor module of claim 23, wherein the wall extends through an aperture in the carrier housing.

25. The sensor module of claim 23, wherein the wall is integrally formed as part of the stiffener, the wall extending transversely from a base portion of the stiffener.

26. The sensor module of claim 23, wherein a wing segment of the sensor substrate is folded around an edge of the stiffener, and wherein a portion of the processor substrate is folded around an edge of the carrier.

* * * * *